(12) United States Patent
Wang et al.

(10) Patent No.: US 9,287,271 B2
(45) Date of Patent: Mar. 15, 2016

(54) VERTICAL TRANSISTOR DEVICES, MEMORY ARRAYS, AND METHODS OF FORMING VERTICAL TRANSISTOR DEVICES

(71) Applicant: Micron Technology, Inc., Boise, ID (US)

(72) Inventors: Kuo Chen Wang, Boise, ID (US); Sriraj Manavalan, Boise, ID (US); Wei Ming Liao, Rueishan Township (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/699,350

(22) Filed: Apr. 29, 2015

(65) Prior Publication Data

US 2015/0236023 A1     Aug. 20, 2015

Related U.S. Application Data

(62) Division of application No. 13/215,981, filed on Aug. 23, 2011.

(51) Int. Cl.
*H01L 21/8239*     (2006.01)
*H01L 27/108*     (2006.01)
(Continued)

(52) U.S. Cl.
CPC .... *H01L 27/10823* (2013.01); *H01L 27/10808* (2013.01); *H01L 27/10876* (2013.01); *H01L 29/66666* (2013.01)

(58) Field of Classification Search
CPC ...................... H01L 29/66666; H01L 29/7788; H01L 29/7827; H01L 29/7826; H01L 27/10876

USPC .......... 438/138, 212, 268; 257/296, 302, 329, 257/E27.096
See application file for complete search history.

(56) References Cited

U.S. PATENT DOCUMENTS

| 3,941,629 A | 3/1976 | Jaffe |
| 4,139,442 A | 2/1979 | Bondur et al. |

(Continued)

FOREIGN PATENT DOCUMENTS

| JP | 53-148389 | 12/1978 |
| JP | 60-167349 | 8/1985 |

(Continued)

OTHER PUBLICATIONS

"Notes from IEDM, part 3", http://www.thinfilmmfg.com/Noteworthy/Noteworthy01/IEDM12Dec01.htm, 2 pages, Dec. 12, 2001.

(Continued)

*Primary Examiner* — Laura Menz
*Assistant Examiner* — Maliheh Malek
(74) *Attorney, Agent, or Firm* — Wells St. John, P.S.

(57) ABSTRACT

A vertical transistor device includes a line of active area adjacent a line of dielectric isolation. A buried data/sense line obliquely angles relative to the line of active area and the line of dielectric isolation. A pair of gate lines is outward of the buried data/sense line and obliquely angle relative to the line of active area and the line of dielectric isolation. A vertical transistor channel region is within the active area between the pair of gate lines. An outer source/drain region is in the active area above the channel region and an inner source/drain region is in the active area below the channel region. The inner source/drain region is electrically coupled to the buried data/sense line. Other devices and structures are contemplated, as are methods of forming a plurality of vertical transistor devices.

20 Claims, 5 Drawing Sheets

(51) Int. Cl.
*H01L 29/66* (2006.01)
*H01L 21/8238* (2006.01)

(56) References Cited

U.S. PATENT DOCUMENTS

| | | | |
|---|---|---|---|
| 4,333,964 A | 6/1982 | Ghezzo | |
| 4,472,459 A | 9/1984 | Fisher | |
| 4,508,757 A | 4/1985 | Fabricius et al. | |
| 4,551,910 A | 11/1985 | Patterson | |
| 4,615,762 A | 10/1986 | Jastrzebski et al. | |
| 4,630,356 A | 12/1986 | Christie et al. | |
| 4,651,183 A * | 3/1987 | Lange | G11C 11/404 257/296 |
| 4,746,630 A | 5/1988 | Hui et al. | |
| 4,789,560 A | 12/1988 | Yen | |
| 4,791,463 A * | 12/1988 | Malhi | H01L 21/2257 257/302 |
| 4,903,344 A | 2/1990 | Inoue | |
| 4,959,325 A | 9/1990 | Lee et al. | |
| 4,965,221 A | 10/1990 | Dennison et al. | |
| 5,013,680 A | 5/1991 | Lowrey et al. | |
| 5,041,898 A | 8/1991 | Urabe et al. | |
| 5,057,449 A | 10/1991 | Lowrey et al. | |
| 5,087,586 A | 2/1992 | Chan et al. | |
| 5,122,848 A | 6/1992 | Lee et al. | |
| 5,128,274 A | 7/1992 | Yabu et al. | |
| 5,149,669 A | 9/1992 | Hosaka | |
| 5,210,046 A | 5/1993 | Crotti | |
| 5,252,504 A | 10/1993 | Lowrey et al. | |
| 5,260,229 A | 11/1993 | Hodges et al. | |
| 5,316,966 A | 5/1994 | Van Der Plas et al. | |
| 5,358,894 A | 10/1994 | Fazan et al. | |
| 5,404,287 A | 4/1995 | Poumey | |
| 5,409,563 A | 4/1995 | Cathey | |
| 5,416,350 A | 5/1995 | Watanabe | |
| 5,438,016 A | 8/1995 | Figura et al. | |
| 5,457,067 A | 10/1995 | Han | |
| 5,458,999 A | 10/1995 | Szabo et al. | |
| 5,466,632 A | 11/1995 | Lur et al. | |
| 5,466,961 A | 11/1995 | Kikuchi et al. | |
| 5,468,675 A | 11/1995 | Kaigawa | |
| 5,607,874 A | 3/1997 | Wang et al. | |
| 5,747,377 A | 5/1998 | Wu | |
| 5,789,306 A | 8/1998 | Roberts et al. | |
| 5,804,851 A | 9/1998 | Noguchi et al. | |
| 5,834,359 A | 11/1998 | Jeng et al. | |
| 5,840,591 A | 11/1998 | Park et al. | |
| 5,864,181 A * | 1/1999 | Keeth | H01L 23/5225 257/776 |
| 5,899,727 A | 5/1999 | Hause et al. | |
| 5,907,170 A | 5/1999 | Forbes et al. | |
| 5,909,618 A | 6/1999 | Forbes et al. | |
| 5,909,630 A | 6/1999 | Roberts et al. | |
| 5,917,745 A | 6/1999 | Fujii | |
| 5,963,469 A | 10/1999 | Forbes | |
| 5,977,579 A | 11/1999 | Noble | |
| 6,007,745 A | 12/1999 | Coates et al. | |
| 6,008,106 A | 12/1999 | Tu et al. | |
| 6,049,106 A | 4/2000 | Forbes | |
| 6,072,209 A | 6/2000 | Noble et al. | |
| 6,077,745 A | 6/2000 | Burns et al. | |
| 6,096,596 A | 8/2000 | Gonzalez | |
| 6,097,065 A | 8/2000 | Forbes et al. | |
| 6,104,068 A | 8/2000 | Forbes | |
| 6,150,687 A | 11/2000 | Noble et al. | |
| 6,172,391 B1 | 1/2001 | Goebel et al. | |
| 6,174,780 B1 | 1/2001 | Robinson | |
| 6,191,470 B1 | 2/2001 | Fobes et al. | |
| 6,245,600 B1 | 6/2001 | Geissler et al. | |
| 6,246,083 B1 | 6/2001 | Noble | |
| 6,274,453 B1 * | 8/2001 | Schlosser | H01L 27/10805 257/301 |
| 6,304,483 B1 | 10/2001 | Noble | |
| 6,306,727 B1 | 10/2001 | Akram | |
| 6,320,222 B1 | 11/2001 | Forbes et al. | |
| 6,337,497 B1 | 1/2002 | Hanafi et al. | |
| 6,350,635 B1 | 2/2002 | Noble et al. | |
| 6,355,961 B1 | 3/2002 | Forbes | |
| 6,365,385 B1 | 4/2002 | Opara | |
| 6,372,559 B1 | 4/2002 | Crowder et al. | |
| 6,376,317 B1 | 4/2002 | Forbes et al. | |
| 6,376,887 B2 | 4/2002 | Tasaka | |
| 6,377,070 B1 | 4/2002 | Forbes | |
| 6,399,979 B1 | 6/2002 | Noble et al. | |
| 6,410,948 B1 * | 6/2002 | Tran | H01L 27/10808 257/201 |
| 6,413,825 B1 | 7/2002 | Forbes | |
| 6,414,356 B1 | 7/2002 | Forbes et al. | |
| 6,417,040 B2 | 7/2002 | Noble | |
| 6,424,001 B1 | 7/2002 | Forbes et al. | |
| 6,440,801 B1 | 8/2002 | Furukawa et al. | |
| 6,448,601 B1 | 9/2002 | Forbes et al. | |
| 6,476,434 B1 | 11/2002 | Noble et al. | |
| 6,492,233 B2 | 12/2002 | Forbes et al. | |
| 6,496,034 B2 | 12/2002 | Forbes et al. | |
| 6,498,062 B2 | 12/2002 | Durcan et al. | |
| 6,504,201 B1 | 1/2003 | Noble et al. | |
| 6,531,727 B2 | 3/2003 | Ahn et al. | |
| 6,537,870 B1 | 3/2003 | Shen | |
| 6,559,491 B2 | 5/2003 | Forbes et al. | |
| 6,566,682 B2 | 5/2003 | Forbes | |
| 6,639,268 B2 | 10/2003 | Forbes et al. | |
| 6,642,566 B1 | 11/2003 | Divakaruni et al. | |
| 6,664,806 B2 | 12/2003 | Forbes et al. | |
| 6,670,642 B2 | 12/2003 | Takaura et al. | |
| 6,696,746 B1 | 2/2004 | Farrar et al. | |
| 6,734,482 B1 * | 5/2004 | Tran | H01L 27/10814 257/296 |
| 6,734,484 B2 | 5/2004 | Wu | |
| 6,756,625 B2 | 6/2004 | Brown | |
| 6,797,573 B2 | 9/2004 | Brown | |
| 6,798,009 B2 | 9/2004 | Forbes et al. | |
| 6,801,056 B2 | 10/2004 | Forbes | |
| 6,806,137 B2 | 10/2004 | Tran et al. | |
| 6,808,979 B1 | 10/2004 | Lin et al. | |
| 6,831,310 B1 | 12/2004 | Mathew et al. | |
| 6,844,591 B1 | 1/2005 | Tran | |
| 6,878,991 B1 | 4/2005 | Forbes | |
| 6,900,521 B2 | 5/2005 | Forbes et al. | |
| 6,906,372 B2 * | 6/2005 | Yamada | H01L 27/10841 257/296 |
| 6,906,953 B2 | 6/2005 | Forbes | |
| 6,936,891 B2 * | 8/2005 | Saito | H01L 27/115 257/202 |
| 6,964,391 B2 | 11/2005 | Hiraguchi | |
| 6,964,895 B2 | 11/2005 | Hsu | |
| 6,992,343 B2 * | 1/2006 | Miyatake | G11C 7/18 257/296 |
| 7,071,043 B2 | 7/2006 | Tang et al. | |
| 7,091,566 B2 | 8/2006 | Zhu et al. | |
| 7,122,425 B2 | 10/2006 | Chance et al. | |
| 7,129,538 B2 | 10/2006 | Lee et al. | |
| 7,139,184 B2 * | 11/2006 | Schloesser | G11C 5/063 257/E21.659 |
| 7,183,164 B2 | 2/2007 | Haller | |
| 7,188,988 B2 | 3/2007 | Koganezawa | |
| 7,199,419 B2 | 4/2007 | Haller | |
| 7,214,621 B2 | 5/2007 | Nejad et al. | |
| 7,224,020 B2 * | 5/2007 | Wang | H01L 21/84 257/315 |
| 7,230,343 B2 * | 6/2007 | Wang | H01L 21/84 257/427 |
| 7,244,659 B2 | 7/2007 | Tang et al. | |
| 7,262,089 B2 | 8/2007 | Abbott et al. | |
| 7,282,401 B2 | 10/2007 | Juengling | |
| 7,285,812 B2 * | 10/2007 | Tang | H01L 21/28132 257/296 |
| 7,291,533 B2 * | 11/2007 | von Schwerin | H01L 27/10823 257/E21.651 |
| 7,349,232 B2 * | 3/2008 | Wang | G11C 7/02 365/149 |
| 7,372,091 B2 | 5/2008 | Leslie | |
| 7,384,849 B2 | 6/2008 | Parekh et al. | |

(56) References Cited

U.S. PATENT DOCUMENTS

| | | | |
|---|---|---|---|
| 7,399,671 B2* | 7/2008 | Burgess | H01L 21/76897 257/E21.507 |
| 7,476,920 B2* | 1/2009 | Schloesser | H01L 21/76232 257/295 |
| 7,501,676 B2 | 3/2009 | Doyle | |
| 7,521,322 B2 | 4/2009 | Tang et al. | |
| 7,642,572 B2* | 1/2010 | Popp | G11C 5/063 257/202 |
| 7,759,704 B2* | 7/2010 | Popp | H01L 27/10882 257/208 |
| 7,902,026 B2* | 3/2011 | Chung | H01L 21/76237 257/E21.629 |
| 7,948,027 B1* | 5/2011 | Renn | H01L 21/84 257/329 |
| 8,105,902 B2* | 1/2012 | Shin | H01L 27/10876 257/E29.262 |
| 8,143,121 B2* | 3/2012 | Lin | H01L 27/10826 257/296 |
| 8,274,106 B2 | 9/2012 | Abbott et al. | |
| 8,294,188 B2* | 10/2012 | Popp | G11C 5/063 257/296 |
| 8,361,856 B2* | 1/2013 | Heineck | H01L 27/10823 257/E27.091 |
| 8,497,541 B2* | 7/2013 | Parekh | G11C 11/405 257/301 |
| 8,519,462 B2* | 8/2013 | Wang | H01L 27/10891 257/298 |
| 8,569,831 B2* | 10/2013 | Heineck | H01L 27/10802 257/296 |
| 8,617,952 B2* | 12/2013 | Kim | H01L 27/228 257/302 |
| 8,633,564 B2* | 1/2014 | Karda | H01L 21/76232 257/506 |
| 8,659,079 B2* | 2/2014 | Liao | H01L 27/10876 257/133 |
| 8,691,680 B2* | 4/2014 | Wang | H01L 27/10882 438/589 |
| 2002/0017671 A1* | 2/2002 | goebel | H01L 27/10864 257/301 |
| 2002/0024081 A1 | 2/2002 | Gratz | |
| 2002/0030214 A1 | 3/2002 | Horiguchi | |
| 2002/0038886 A1 | 4/2002 | Mo | |
| 2002/0109173 A1 | 8/2002 | Forbes et al. | |
| 2002/0109176 A1 | 8/2002 | Forbes et al. | |
| 2003/0001290 A1 | 1/2003 | Nitayama et al. | |
| 2003/0015757 A1 | 1/2003 | Ohsawa | |
| 2003/0227072 A1 | 12/2003 | Forbes et al. | |
| 2004/0029346 A1* | 2/2004 | Jaiprakash | H01L 27/10867 438/268 |
| 2004/0217391 A1 | 11/2004 | Forbes | |
| 2005/0017281 A1 | 1/2005 | Lowrey | |
| 2005/0054158 A1* | 3/2005 | Divakaruni | H01L 21/763 438/246 |
| 2005/0079721 A1 | 4/2005 | Buerger et al. | |
| 2005/0145913 A1 | 7/2005 | Katsumata et al. | |
| 2005/0199912 A1* | 9/2005 | Hofmann | H01L 21/28282 257/204 |
| 2006/0043431 A1 | 3/2006 | Eppich | |
| 2006/0043450 A1 | 3/2006 | Tang et al. | |
| 2006/0258084 A1 | 11/2006 | Tang et al. | |
| 2007/0051997 A1* | 3/2007 | Haller | H01L 21/823487 257/302 |
| 2007/0082448 A1* | 4/2007 | Kim | H01L 27/10876 438/268 |
| 2007/0181925 A1* | 8/2007 | Yoon | H01L 29/7828 257/296 |
| 2007/0187736 A1* | 8/2007 | Akiyama | G11C 7/065 257/296 |
| 2007/0228434 A1* | 10/2007 | Shimojo | G11C 5/02 257/296 |
| 2009/0121268 A1 | 5/2009 | Lee et al. | |
| 2009/0140342 A1* | 6/2009 | Chakihara | H01L 21/823885 257/365 |
| 2009/0230466 A1* | 9/2009 | Kim | H01L 27/10885 257/331 |
| 2009/0256187 A1 | 10/2009 | Kim | |
| 2009/0267126 A1* | 10/2009 | Wang | H01L 21/823437 257/302 |
| 2010/0052027 A1* | 3/2010 | Abbott | H01L 21/28132 257/306 |
| 2010/0097835 A1* | 4/2010 | Popp | G11C 5/063 365/63 |
| 2010/0237405 A1* | 9/2010 | Shin | H01L 27/10876 257/329 |
| 2010/0244271 A1* | 9/2010 | Ujihara | H01L 21/02063 257/773 |
| 2011/0111568 A1* | 5/2011 | Kim | H01L 27/0207 438/268 |
| 2011/0140196 A1* | 6/2011 | Renn | H01L 21/84 257/329 |
| 2011/0156118 A1* | 6/2011 | Park | H01L 27/0207 257/306 |
| 2011/0198758 A1* | 8/2011 | Jeon | H01L 21/28525 257/774 |
| 2011/0215391 A1* | 9/2011 | Takaishi | H01L 23/58 257/306 |
| 2011/0217819 A1* | 9/2011 | Abbott | H01L 27/10885 438/239 |
| 2011/0220980 A1* | 9/2011 | Parekh | G11C 11/405 257/302 |
| 2011/0220994 A1* | 9/2011 | Parekh | H01L 27/10882 257/334 |
| 2011/0227145 A1* | 9/2011 | Renn | H01L 27/10823 257/328 |
| 2011/0233662 A1* | 9/2011 | Mikasa | H01L 27/10823 257/330 |
| 2011/0284939 A1* | 11/2011 | Chung | H01L 27/10805 257/296 |
| 2012/0001346 A1* | 1/2012 | Kim | H01K 27/10888 257/774 |
| 2012/0007186 A1* | 1/2012 | Seo | H01L 27/0688 257/368 |
| 2012/0007258 A1* | 1/2012 | Oh | H01L 21/743 257/776 |
| 2012/0012926 A1* | 1/2012 | Ha | H01L 27/10823 257/330 |
| 2012/0021575 A1* | 1/2012 | Jang | H01L 27/10876 438/269 |
| 2012/0038005 A1* | 2/2012 | Burgess | H01L 21/76897 257/401 |
| 2012/0039104 A1* | 2/2012 | Lin | H01L 21/823487 365/63 |
| 2012/0049261 A1* | 3/2012 | Fujimoto | H01L 27/10808 257/300 |
| 2012/0056255 A1* | 3/2012 | Sukekawa | H01L 27/10823 257/296 |
| 2012/0104491 A1* | 5/2012 | Heineck | H01L 27/10876 257/334 |
| 2012/0112270 A1* | 5/2012 | Park | H01L 21/2257 257/330 |
| 2012/0119278 A1* | 5/2012 | Mikasa | H01L 27/10823 257/306 |
| 2012/0208364 A1* | 8/2012 | Rouh | H01L 21/31144 438/666 |
| 2012/0217570 A1* | 8/2012 | Kim | H01L 27/10876 257/324 |
| 2012/0228699 A1* | 9/2012 | Lu | H01L 29/4236 257/330 |
| 2012/0243313 A1* | 9/2012 | Cai | G11C 16/10 365/185.05 |
| 2012/0248518 A1* | 10/2012 | Li | H01L 21/76229 257/296 |
| 2012/0273874 A1* | 11/2012 | Wu | H01L 29/66666 257/330 |
| 2012/0302050 A1* | 11/2012 | Matsui | H01L 27/10876 438/559 |
| 2013/0011987 A1* | 1/2013 | Park | H01L 27/10876 438/381 |
| 2013/0015551 A1* | 1/2013 | Wang | H01L 27/10882 257/499 |
| 2013/0032879 A1* | 2/2013 | Lee | H01L 21/743 257/329 |
| 2013/0043525 A1* | 2/2013 | Yu | H01L 27/10814 257/329 |

(56) References Cited

U.S. PATENT DOCUMENTS

| | | | |
|---|---|---|---|
| 2013/0234282 A1* | 9/2013 | Park | H01L 27/0207 257/508 |
| 2013/0235642 A1* | 9/2013 | Heineck | G11C 5/025 365/72 |
| 2013/0320442 A1* | 12/2013 | Liao | H01L 27/10876 257/334 |
| 2014/0252458 A1* | 9/2014 | Sung | H01L 27/108 257/329 |
| 2015/0028406 A1* | 1/2015 | Tang | H01L 27/10876 257/296 |

FOREIGN PATENT DOCUMENTS

| | | |
|---|---|---|
| JP | 1-100948 | 4/1989 |
| JP | 2-219253 | 8/1990 |
| JP | 4-130630 | 5/1992 |
| JP | 4-162528 | 6/1992 |

OTHER PUBLICATIONS

"Quantum confinement effects in a 3D FinFET transistor", http://www.ise.com/appex/FinFET/FinFET.html, 5 pages, Jan. 15, 2003.

Abhinav et al., "An analytical temperature dependent threshold voltage model for thin film surrounded gate SOL MOSFET", Proceedings of the SPIE—The International Society for Optical Engineering, vol. 3975, pt. 1-2, 2000, pp. 605-608.

Ahn et al., "Examination and improvement of reading disturb characteristics of a surrounded gate STTM memory cell", In: 2003 Third IEEE Conference on Nanotechnology, IEEE-NANO 2003, Proceedings (Cat. No. 03TH8700), Piscataway, NJ, USA: IEEE, 2003,. pp. 528-530. vol. 2.

Ahn et al., "Highly scalable and CMOS-compatible STTM cell technology", In: IEEE International Electron Devices Meeting 2003, Pisacataway, NJ, USA: IEEE, 2003, pp. 10.4.1-4.

Cho et al., "A novel pillar DRAM< cell 4 Gbit and beyond", Digest of Technical Papers Symposium on VLSI Technology, Jun. 9-11, 1998, pp. 38-39.

Cho et al., "High performance fully and partially depleted poly-Si surrounding gate transistors", In: 1999 Symposium on VLSI Technology, Digest of Technical Papers (IEEE Cat. No. 99CH 36325), Tokyo, Japan: Japan Soc. Appl. Phys, 1999, pp. 31-32.

Clarke, "ISSCC: Vertical transistor structures considered,"EE Times Website, http://www.eetimes.com, 3 pages, Feb. 9, 2000.

Date et al., "Suppression of the floating-body effect using SiGe layers in vertical surrounding-gate MOSFETs", IEEE Transactions on Electron Devices, vol. 48, No. 12, Dec. 2001, pp. 2684-2689.

De et al., "Impact of gate workfunction on device performance at the 50nm technology node", Solid-State Electronics, vol. 44, No. 6, Jun. 2000, pp. 1077-1080.

Denton et al., "Fully depleted dual-gate thin-film SOI p-MOSFET's fabricated in SOI islands with an isolated buried polysilicon backgate", IEEE Electron Device Lett., vol. 17, No. 11, pp. 509-511, Nov. 1996.

Doyle et al., "High performance fully-depleted tri-gate CMOS transistors", IEEE Electron Device Letters, vol. 24, No. 4, Apr. 2003, pp. 263-265.

Doyle et al., "Tri-Gate fully-depleted CMOS transistors: fabrication, design and layout", 2003 Symposium on VLSI Technology, Digest of Technical Papers, Tokyo; Japan Soc. Applied Phys, 2003, pp. 133-134.

Endo et al., "Novel ultra high density flash memory with a stacked-surrounding gate transistor (S-SGT) structured cell", In: International Electron Devices Meeting, Technical Digest, IEEE, 2001, pp. 2.3.1-4.

Endoh et al., "2.4F2 memory cell technology with stacked-surrounding gate transistor (S-SGT) DRAM", Electron Devices, IEEE Transactions on vol. 48, Issue 8, Aug 2001, pp. 1599-1603.

Endoh et al., "A high signal swing pass-transistor logic using surrounding gate transistor", In: 2000 International Conference on Simulation Semiconductor Processes and Devices (Cat. No. 00TH8502), Piscataway, NJ, USA: IEEE, 2000, pp. 273-275.

Endoh et al., "An accurate model of fully-depleted surrounding gate transistor (FD-SGT)", IEICE Transactions on Electronics, vol. E80-C, No. 7, Jul. 1997, pp. 905-910.

Endoh et al., An analytic steady-state curent-voltage characteristic of short channel fully-depleted surrounding gate transistor (FD-SGT), IEICE Transactions on Electronics, vol. E80-C, No. 7, Jul. 1997, pp. 911-917.

Endoh et al., "Analysis of high speed operation for multi-SGT", Transactions of the Institute of Electronics, Information and Communication Engineers, C-1, vol. J80C-1, No. 8, Aug 1997, pp. 382-383.

Endoh et al., "Floating channel type SGT flash memory", Transactions of the Institute of Electronics, Information and Communication Engineers C-1, vol. J82C-1, No. 3, Mar. 1999, pp. 134-135.

Endoh et al., "The 1.44F2 memory cell technology with the stacked-surrounding gate transistor (S-SGT) DRAM", Microelectronics 2000. Proceedings. 2000 22nd International Conference on, vol. 2, May 14-17, 2000, pp. 451-454.

Endoh et al., "The analysis of the stacked-surrounding gate transistor (S-SGT) DRAM for the high speed and low voltage operation", IEICE Transactions on electronics, vol. E81-C, No. 9, Sep. 1998, pp. 1491-1498.

Endoh et al., "The stacked-SGT DRAM using 3D-building memory array technology", Transactions of the INstitute of Electronics, Information and Communication Engineers C-1, vol. J81C-1, No. 5, May 1998, pp. 288-289.

Forbes, "DRAM aray with surrounding gate access transistors and capacitors over global bit lines"Corvallis, OR, 20 pages.

Goebel et al., "Fully depleted surrounding gate transistor (SGT) for 70nm DRAM and beyond", Electron Devices Meeting, 2002, IEDM '02 Digest, International, Dec. 8-11, 2002, pp. 275-278.

Hioki et al., "An analysis of program and erase operation for FC-SGT flash memory cells", In: 2000 International Conference on Simulation Semiconductor Processes and Devices (Cat. No. 00TH8502), Piscataway, NJ, USA: IEEE, 2000, pp. 116-118.

Huang et al., "sub-50nm P-Channel FinFET", IEEE Transactions on Electron Devices, vol. 48, No. 5, May 2001.

Iwai et al., "Buried gate type SGT flash memory", Transactions of the Institute of Electronics, Information and Communication Engineers C, vol. J86-C, No. 5, May 2003, pp. 562-564, Journal Paper.

Kalavade et al., "A novel sub-10nm transistor", IEEE Device Research Conf., Denver, CO pp. 71-72, Jun. 2000.

Kedzierski et al., "High-performance symmetric-gate and CMOS-compatible Vt asymmetric-gate FinFET devices", IEDM, 2001, paper 19.5.

Kim et al., "Nanoscale CMOS circuit leakage power reduction by double-gate device", International Symposium on Low Power Electronics and Design, Newport Beach, Marriott Hotel, Newport, California, Aug. 9-11, 2004, http://www.islped.org.

Kranti et al., "Optimisation for improved short-channel performance of surrounding/cylindrical gate MOSFETs", Electronics Letter, vol. 37, Issue 8, Apr. 12, 2001. pp. 533-534.

Lau et al., "High aspect ratio submicron silicon pillars fabricated by photoassisted electrochemical etching and oxidation", Applied Physics Letters, vol. 67(13), pp. 1877-1879, Sep. 25, 1995.

Lau et al., "High aspect ratio sub-micron silicon pillars for light emission studies and photonic band gap material application", 1995/6 Research Journal, Microelectronics Group, 3 pages, Jun. 1996.

Lutze et al., "Field oxide thinning in poly buffer LOCOS isolation with jActive area spacings to 0.1 um", Journal of Electrochemical Society, vol. 137, No. 6, pp. 1867-1870 (Jun. 1990).

Mandelman et al., "Challenges and future directions for the scaling of dynamic random-access memory(DRAM)", IBM J. Res. & Dev., vol. 46, No. 2/3, pp. 187-212 (Mar./May 2002).

Matsuoka et al., "A study of soft error in SGT DRAM", Record of Electrical and Comunication Engineering, Conversazione Tohoku University, vol. 71, No. 1, Oct. 2002. pp. 469-70, Journal Paper.

(56) References Cited

OTHER PUBLICATIONS

Matsuoka et al., "Numerical analysis of alpha-particle-induced soft errors in floating channel type surrounding gate transistor (FC-SGT) DRAM cell", Electron Devices, IEEE Transactions on, vol. 50, Issue 7, Jul. 2003, pp. 1638-1644.

Miyamoto et al., "Effect of LDD structure and channel poly-Si thinning on a gate-all-around TFT (GAT) for SRAM's", IEEE Transactions on Electron Devices, vol. 46, No. 8, Aug 1999, pp. 1693-1698.

Miyano et al., "Numerical analysis of a cylindrical thin-pillar transistor (CYNTHIA)", IEEE Transactions on Electron Devices, vol. 39, No. 8, Aug. 1992, pp. 1876-1881.

Nakamura, "A study of steady-state characteristics of SGT type three-dimensional MOS transistor", Record of electrical anc Dommunication Engineering Conversazione Tohoku University, vol. 66, No. 1, Jan. 1998, pp. 211-212.

Nishi et al., "Analysis of the shape of diffusion layer of SGT for suppressing subtrate bias effect", Transactions of the Institute of Electronics, Information and Communication Engineers C, vol. J84-C, No. 10, Oct. 2001, pp. 1018-1020.

Nishi et al., "Concave Source SGT for suppressing punch-through effect", Transactions of the Institute of Electronics, Information and Communication Engineers C. vol. J86-C, No. 2, Feb. 2003, pp. 200-201.

Nitayama et al., "High speed and compact CMOS circuits with Multipillar surrounding gate transistors", IEEE Transactions on Electron Devices, vol. 36, No. 11, pt. 1, Nov. 1989, pp. 2605-2606.

Nitayama, "Multi-pillar surrounding gate transistor (M-SGT) for compact and high-speed circuits", Electron Devices, IEEE Transactions on, vol. 38, Issue 3, Mar. 1991, pp. 579-583.

Richardson et al., "A Trench Transistor Cross-Point DRAM Cell", 1985 IEEE, pp. 714-717.

Sakai et al., "A study of stacked-SGT-based pass-transistor logic circuit", Record of Electrical and Communication Engineering Conversazione Tohoku University, vol. 72, No. 2, Feb. 2004, pp. 108-109.

Sakamoto et al., "A study of current drivability of SGT", Record of Electrical and Communication Engineering, Conversazione Tohoku University, vol. 72, No. 2, Feb 2004, pp. 110-111.

Seeger et al., "Fabrication of ordered arrays of silicon nanopillars", J. Phys. D: Appl. Phys., vol. 32, pp. L129-L132, (1999).

Sunouchi et al., "A surrounding gate transistor (SGT) cell for 64/256 Mbit DRAMs", Electron Devices Meeting, 1989, Technical Digest, International, Dec. 3-6, 1989, pp. 23-26.

Takato et al., "High performance CMOS surrounding gate transistor (SGT) for ultra high density LSIs", Electron Devices Meeting, 1988. Technical Digest, International, Dec. 11-14, 1988, pp. 222-225.

Takato et al., "Impact of surrounding gate transistor (SGT) for ultra-high density LSI's", Electron Devices, IEEE Transactions on, vol. 38, Issue 3, Mar. 1991, pp. 573-578.

Terauchi et al., "A surrounding Gate Transistor (SGT) Gain Cell for Ultra High Density DRAMs", VLSI Technology, 1993. Digest of Technical Papers, 1993 Symposium on, May 17-19, 1993, pp. 21-22.

Terauchi et al., "Depletion isolation effect of surrounding gate transistors", IEEE Transactions on, vol. 44, Issue 12, Dec. 1997, pp. 2303-2305.

Watanabe et al., "A novel circuit technology with surrounding gate transistors (SGT's) for ultra high density DRAM's", Solid-State Circuit, Journal of IEEE, vol. 30, Issue 9, Sep. 1995. pp. 960-971.

Watanabe, "Impact of three-dimensional transistor on the pattern area reduction for ULSI", IEEE Transaction on Electron Devices, vol. 50. No. 10, Oct. 2003, pp. 2073-2080.

Wolf et al., "Silion processing for the VLSI era", vol. 1, Lattice Press, CA, USA, pp. 529-555 (1986).

Wong et al., "Self-aligned (top and bottom) double-gate MOSFET with a 25nm thick silicon channel", IEEE Int. Electron Device Meeting, 1997, pp. 427-430.

Xuan et al, "60nm planarized ultra-thin body solid phase epitaxy MOSFETs", IEEE Device Research Conf., Denver, CO., pp. 67-68, Jun. 2000.

Yamashita et al., "A study of process design in three dimensional SGT device", Record of Electrical and Communication Engineering, Conversazione Tohoku University, vol. 71, No. 1, Oct 2002, pp. 467-468.

Zhang et al.; A study of load capacitance in SGT; Record of Electrical and Communication Engineering, Conversazione Tohoku University, vol. 71, No. 1, Oct. 2002, pp. 473-474.

\* cited by examiner

VERTICAL TRANSISTOR DEVICES, MEMORY ARRAYS, AND METHODS OF FORMING VERTICAL TRANSISTOR DEVICES

RELATED PATENT DATA

This patent resulted from a continuation application of U.S. patent application Ser. No. 13/215,981, filed Aug. 23, 2011, entitled "Vertical Transistor Devices, Memory Arrays, And Methods Of Forming Vertical Transistor Devices", naming Kuo Chen Wang, Sriraj Manavalan, and Wei Ming Liao as inventors, the disclosure of which are incorporated by reference.

TECHNICAL FIELD

Embodiments disclosed herein pertain to vertical transistor devices, to memory arrays, and to methods of forming vertical transistor devices.

BACKGROUND

Integrated circuits may be formed on a semiconductor substrate such as a silicon wafer or other semiconductive material. In general, layers of various materials which are semiconductive, conductive, or electrically insulative are used to form the integrated circuits. By way of examples, the various materials may be doped, ion implanted, deposited, etched, grown, etc. using various processes. A continuing goal in semiconductor processing is to strive to reduce the size of individual circuitry components, thereby enabling smaller and denser integrated circuitry. One type of component used in integrated circuitry is a transistor.

Memory is one type of integrated circuitry, and is used in computer systems for storing data. Memory may be fabricated in one or more arrays of individual memory cells. Memory cells may be written to or read from using digit lines (which may also be referred to as bit lines, data lines, sense lines, or data/sense lines) and access lines (which may also be referred to as gate lines or word lines). The digit lines may electrically interconnect memory cells along columns of the array, and the access lines may electrically interconnect memory cells along rows of the array. Each memory cell may be uniquely addressed through the combination of a digit line and an access line.

Memory cells may be volatile, semi-volatile, or non-volatile. Non-volatile memory cells can store data for extended periods of time, in many instances including when the computer is turned off. Volatile memory dissipates and therefore requires being refreshed/rewritten, in many instances multiple times per second. Regardless, memory cells are configured to retain or store memory in at least two different selectable states. In a binary system, the states are considered as either a "0" or a "1". In other systems, at least some individual memory cells may be configured to store more than two levels or states of information.

DETAILED DESCRIPTION OF EXAMPLE EMBODIMENTS

Embodiments of the invention include vertical transistor device constructions, pluralities of vertical transistor devices, memory arrays which include a plurality of vertical transistor devices, and methods of forming a plurality of vertical transistor devices. In this document, vertical is a direction generally orthogonal to a primary surface relative to which the substrate is processed during fabrication and which may be considered to define a generally horizontal direction. Further, "vertical" and "horizontal" as used herein are generally perpendicular directions relative one another independent of orientation of the substrate in three dimensional space. Further, words such as "underlying", "outward", "beneath", "above", and "elevationally" are relative terms corresponding to the vertical direction with respect to the structure being described.

Example embodiments of a vertical transistor device, including a plurality of such devices, are initially described with respect to a portion of a substrate 10 shown in FIGS. 1-7. Substrate 10 may comprise a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Substrate 10 comprises a suitable base substrate 12 which may be homogenous or non-homogenous, for example comprising multiple different composition materials and/or layers. As an example, such may comprise both monocrystalline silicon and/or a semiconductor-on-insulator substrate. Base substrate 12 comprises semiconductive material 14, for example monocrystalline or polycrystalline silicon, gallium arsenide, indium phosphide, or any other existing or yet-to-be-developed material possessing semiconductor properties, including any combinations of such materials. In one example, semiconductor material 14 comprises bulk monocrystalline silicon lightly background doped with a p-type conductivity modifying impurity.

Figures 1, 2:
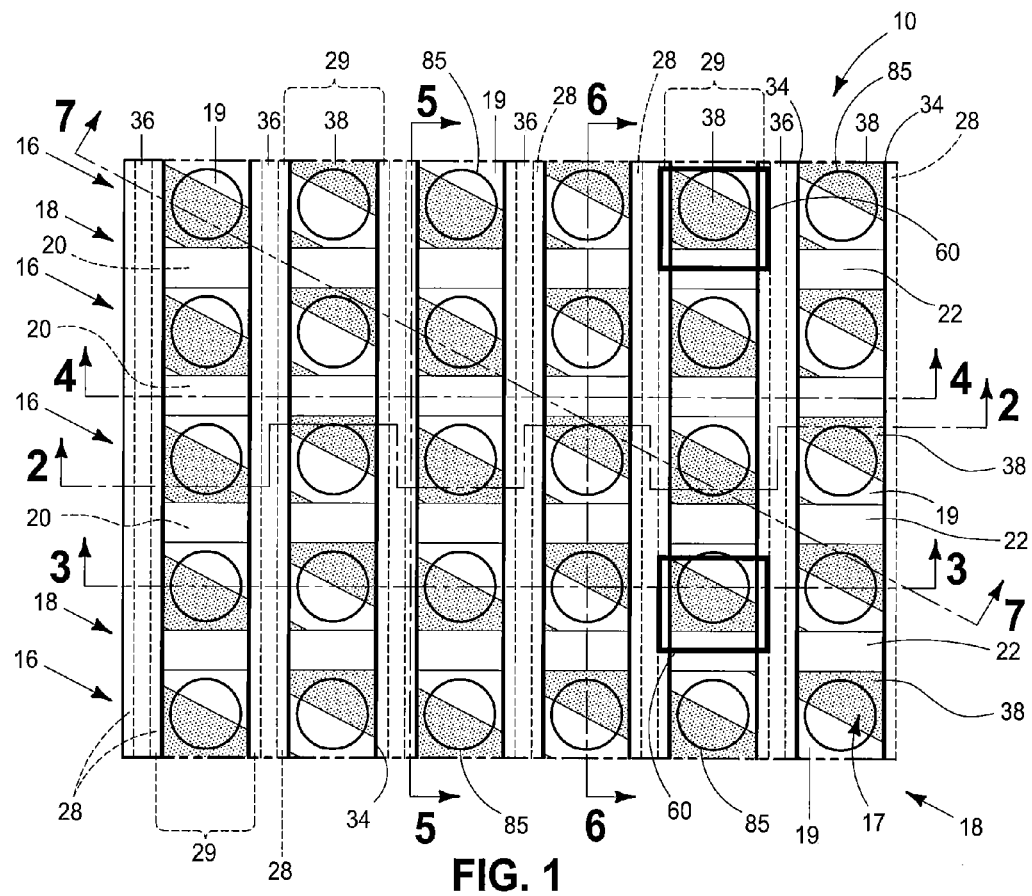
FIG. 1 is a diagrammatic top plan view of an array of vertical transistor devices in accordance with an embodiment of the invention.
FIG. 2 is a sectional view taken through line 2-2 in FIG. 1.
Figure 3:
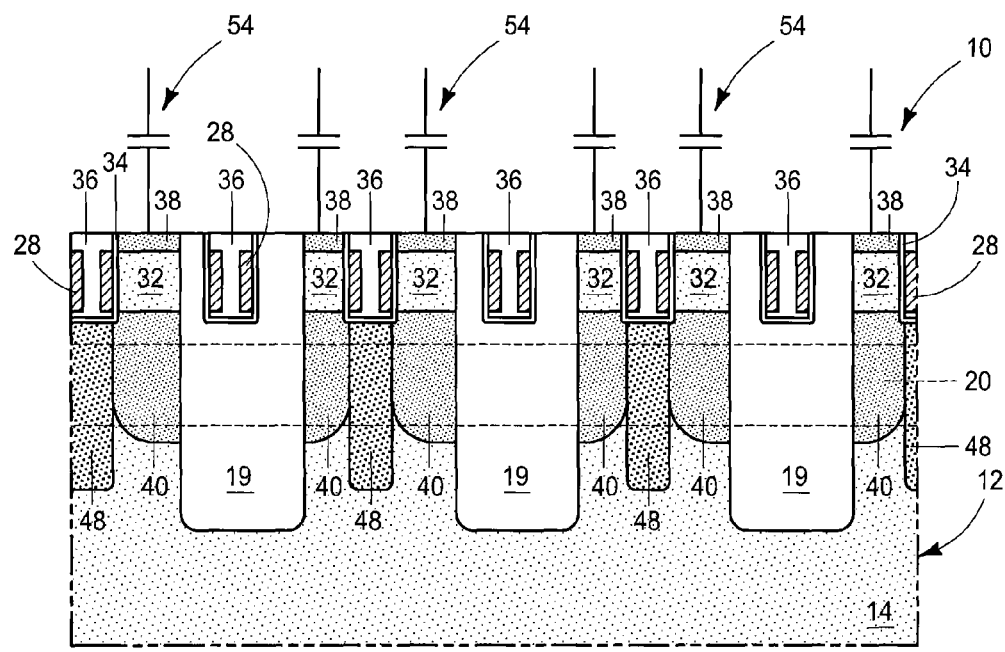
FIG. 3 is a sectional view taken through line 3-3 in FIG. 1.
Figure 4:
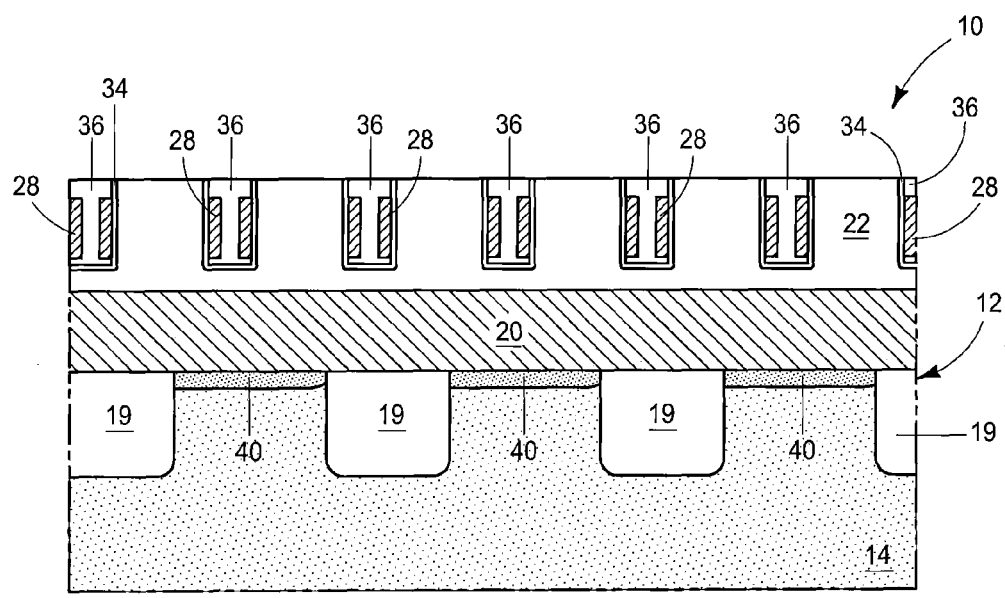
FIG. 4 is a sectional view taken through line 4-4 in FIG. 1.
Figure 5:
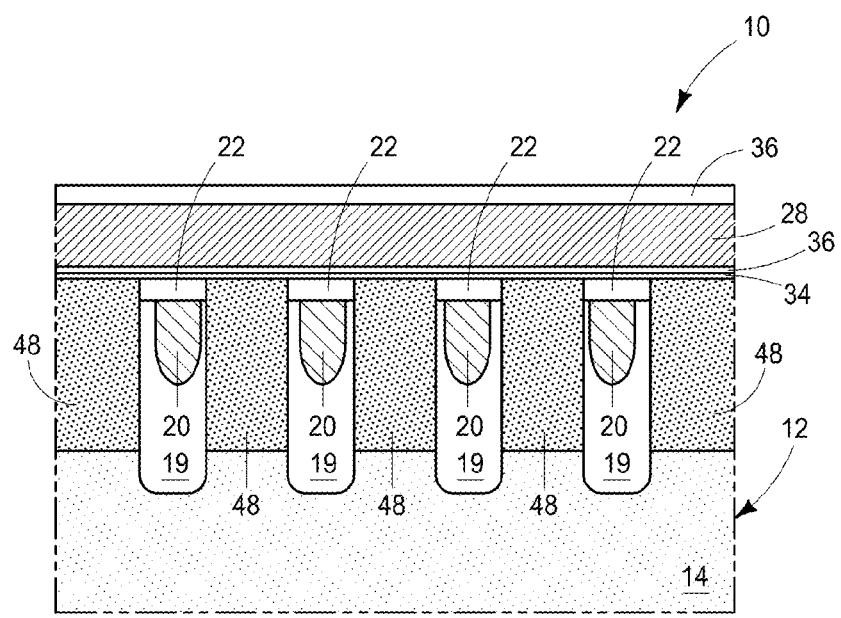
FIG. 5 is a sectional view taken through line 5-5 in FIG. 1.

Substrate 10 includes active area lines 16 which alternate with dielectric isolation lines 18 (FIG. 1). Dielectric material of the dielectric isolation lines may be homogenous or non-homogenous, with an example material 19 of isolation lines 18 including doped or undoped silicon dioxides, silicon nitrides, and any combinations thereof. Active area may be considered as a combination of materials or regions 38, 32, 14, 40, and 48 (described subsequently), with material/region 38 as active area being viewable in FIG. 1.

Lines 16 and/or 18 may be straight linear as shown. Alternately by way of example, lines 16 and/or lines 18 may not be straight linear, for example respectively extending longitudinally curvilinear (not shown). Lines 16 and/or lines 18 might have substantially vertical sidewalls (as shown) or non-vertical sidewalls (not shown), for example tapering laterally inward to be increasingly narrower deeper within substrate 10. Each of active area lines 16 may be of constant and/or the same maximum widths (e.g., at the elevationally outermost surface of substrate 10 taken perpendicular to the longitudinal orientation of the line). Dielectric isolation lines 18 may be of constant and/or the same maximum width (e.g., at the elevationally outermost surface of substrate 10 taken perpendicular to the longitudinal orientation of the line). Further, the maximum widths of active area lines 16 and dielectric isolation lines 18 may be the same or different. In one embodiment, the maximum widths of the active area lines are the same relative one another and the maximum widths of the dielectric isolation lines are the same relative one another. In one embodiment, the active area lines are from 1.1 to 1.4 times wider than the dielectric isolation lines. Example maximum widths for active area lines 16 and dielectric isolation lines 18 are from about 80 Angstroms to about 800 Angstroms. An example depth of the deepest portion of dielectric isolation lines 18 from the outermost surface of substrate 10 is from about 2,000 Angstroms to about 6,000 Angstroms.

Substrate 10 includes buried data/sense lines 20 that obliquely angle relative to active area lines 16 and dielectric isolation lines 18. An example oblique angle is from about 10° to about 60°. Lines 20 comprise one or more conductive materials, for example conductively doped semiconductor materials, elemental metals, alloys of elemental metals, and/or conductive metal compounds. Examples include one or more of titanium, titanium nitride, tungsten, and ruthenium. Buried data/sense lines 20 may be longitudinally straight, curvilinear, or of other configuration(s). Further, buried data/sense lines 20 may be of the same maximum and/or minimum widths, or of different maximum and/or minimum widths, relative one another. An example elevational thickness for buried data/sense lines 20 is from about 150 Angstroms to about 1,000 Angstroms, and an example maximum width is from about 100 Angstroms to about 800 Angstroms. Dielectric material 22 is over data/sense lines 20. Such may be homogenous or non-homogenous, and may comprise one or more of the same materials, or different materials, as dielectric isolation material 19.

Substrate 10 includes pairs 29 of gate lines 28 outward of buried data/sense lines 20 and which obliquely angle relative to active area lines 16 and dielectric isolation lines 18. Individual vertical transistor channel regions 32 (FIGS. 2, 3, 6, and 7) are within the active area between gate lines 28 of individual pairs 29 of gate lines 28. Gate lines 28 may be of the same or different dimensions relative one another, and may be of the same or different composition from that of buried data/sense lines 20. An example elevational thickness for gate lines 28 is from about 200 Angstroms to about 1,200 Angstroms, and an example maximum width is from about 30 Angstroms to about 250 Angstroms. In one embodiment, gate lines 28 within pairs 29 are parallel and longitudinally straight relative one another. In one embodiment, buried data/sense lines 20 are perpendicular relative to pairs 29 of gate lines 28. A gate dielectric 34 is between gate lines 28 and channel regions 32. Such may comprise silicon dioxide, silicon nitride, and other high k dielectrics, including combinations thereof. Dielectric material 36 is over gate lines 28. Such may be homogenous or non-homogenous, and may be of the same composition(s) as dielectric isolation 19 and/or dielectric material 22.

Substrate 10 includes pairs of outer source/drain regions 38 and inner source/drain regions 40 (FIGS. 2, 3, 6, and 7) within or as part of the active area above and below, respectively, individual channel regions 32. Inner source/drain regions 40 individually electrically couple to individual buried data/sense lines 20. In one embodiment, inner source/drain regions 40 are directly against the individual buried data/sense lines 20, and may be considered as comprising buried data/sense line contacts. In this document, a material or structure is "directly against" another when there is at least some physical touching contact of the stated materials or structures relative one another. In contrast, "over" encompasses "directly against" as well as constructions where intervening material(s) or structure(s) result(s) in no physical touching contact of the stated materials or structures relative one another. Source/drain regions 38, 40 together may be primarily of opposite conductivity type and greater dopant concentration to that of channel region 32. Buried data/sense lines 20 may be considered as individually comprising opposing sidewalls 42 and a base 44 (FIG. 7). In one embodiment, inner source/drain regions 40 are directly against a data/sense line sidewall 42, and in one embodiment against both sidewalls 42, of individual buried data/sense lines 20. In one embodiment, inner source/drain regions 40 are directly against a buried data/sense line base 44 of individual buried data/sense lines 20.

In one embodiment, a doped isolation region 48 (FIGS. 2, 3, 5, 7, and 8) is provided within lines 16 of active area (e.g. within material 14) between immediately adjacent buried data/sense lines 20. FIG. 8 is like FIG. 1 and provided to show relative example positioning of isolation implant regions 48. However, numerous components from FIG. 1 are not shown in FIG. 8 solely for purpose of clarity in showing example regions 48. Isolation regions 48 may comprise conductivity enhancing dopant opposite in type to that of source/drain regions 38, 40; of lower, the same, or higher concentration as that of regions 38, 40; and of higher dopant concentration and the same type as that of channel regions 32. An example dopant concentration for isolation regions 48 is from about $5 \times 10^{17}$ ions/cm$^3$ to about $2 \times 10^{19}$ ions/cm$^3$. Doped isolation regions 48 may be provided to preclude significant current leakage, and thereby provide isolation, between immediately adjacent data/sense lines relative to or through semiconductor material 14.

In one embodiment, some of the outer source/drain regions have outer target contact areas having trapezoidal shaped perimeters when considered or viewed horizontally. In one embodiment, some of the outer source/drain regions have respective outer target contact areas having pentagonal shaped perimeters when considered or viewed horizontally. For example referring to FIG. 8, some trapezoidal shaped target contact areas 50 and some pentagonal shaped target contact areas 52 are shown with respect to source/drain regions 38.

In one embodiment, individual charge storage components are electrically coupled to individual outer source/drain regions 38. FIGS. 2, 3, 6, and 7 schematically show example charge storage components in the form of capacitors 54. The charge storage component may be directly against outer source/drain region 38. In one embodiment, the charge storage component is directly against both outer source/drain region 38 and dielectric isolation 19. In one embodiment, an outer source/drain region 38 has an outer target contact area having a trapezoidal shape perimeter considered horizontally or a pentagonal shape perimeter considered horizontally, with the charge storage component being directly against only a portion of the outer target contact area. As examples, FIG. 1 shows example actual contact areas 85 of capacitors 54 with source/drain regions 38 which are in the form of circles. Other shapes and/or sizes may be used or result for the actual contact areas.

Figure 6:
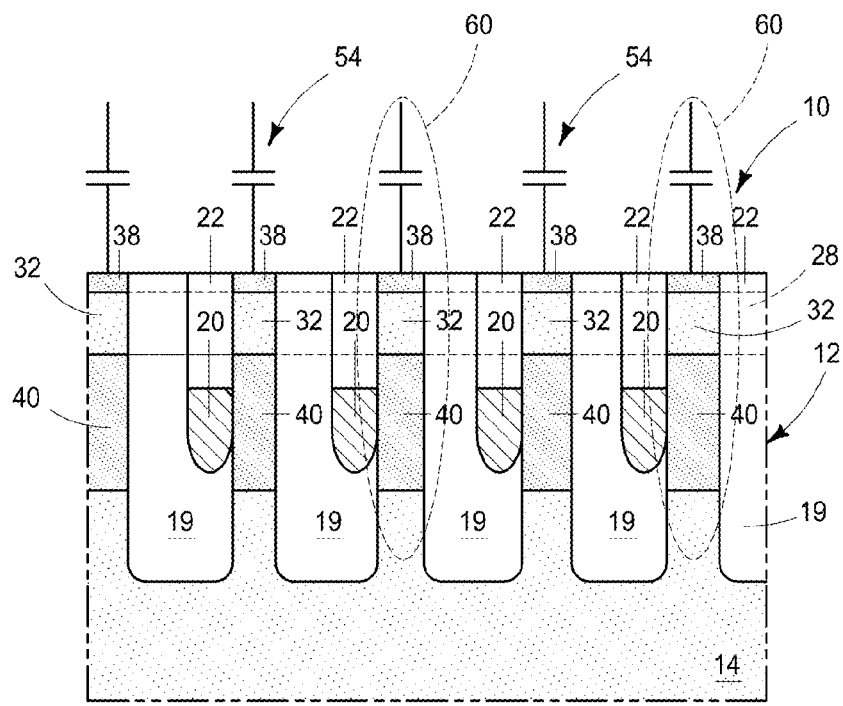
FIG. 6 is a sectional view taken through line 6-6 in FIG. 1.
Figure 7:
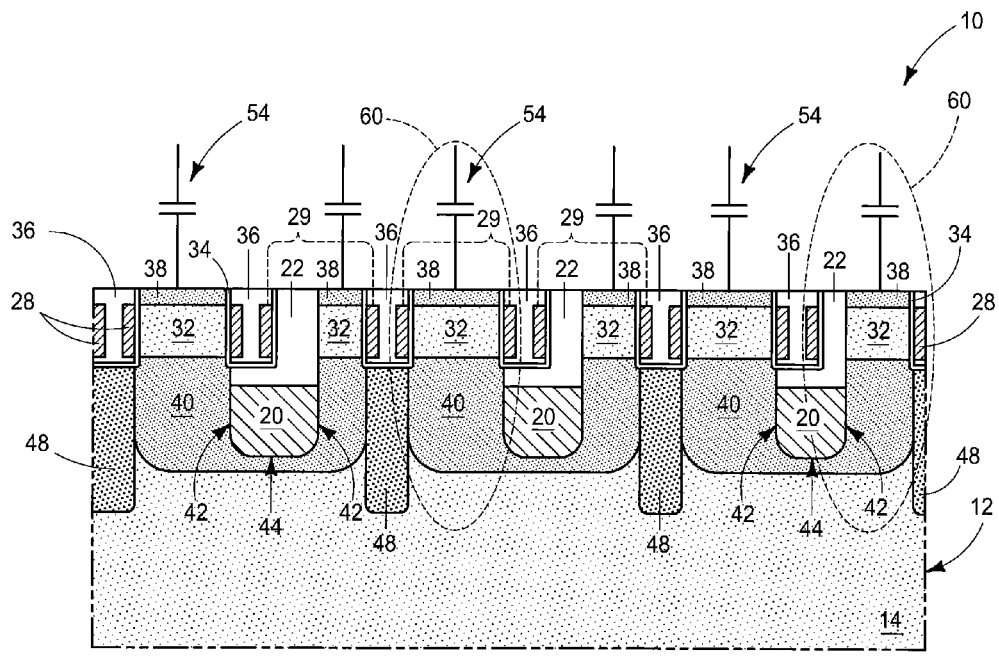
FIG. 7 is a sectional view taken through line 7-7 in FIG. 1.
Figure 8:
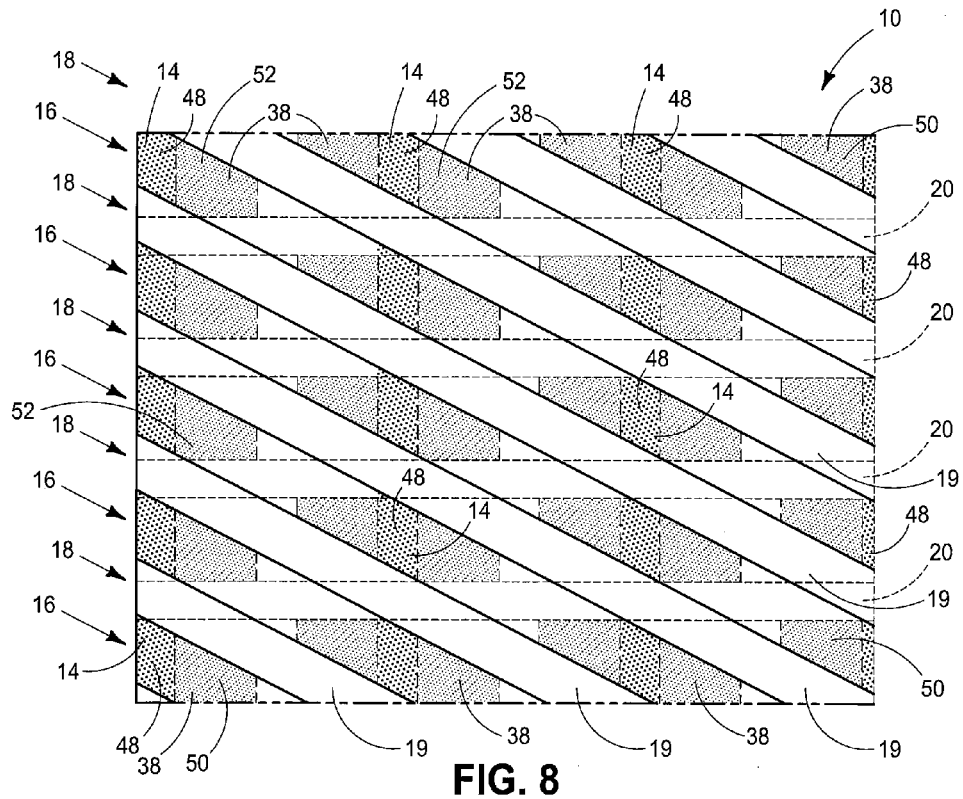
FIG. 8 is another diagrammatic top plan view of the array of FIG. 1, but where many components have been removed solely for clarity to show example location of structure not otherwise viewable in FIG. 1.

Example individual vertical transistor devices are shown within respective outlines 60 in FIGS. 6 and 7. In one embodiment, individual devices 60 may comprise a memory cell. In one embodiment, individual devices 60 may occupy an area averaging slightly more than $4F^2$ of horizontal area, where "F" is the minimum lateral feature dimension of the smallest feature that is formed using feature edges of a mask pattern that is received outwardly of material from which the smallest features are formed.

An example vertical transistor device in accordance with one embodiment of the invention comprises a line of active area adjacent a line of dielectric isolation. A buried data/sense line is obliquely angled relative to the line of active area and the line of dielectric isolation. A pair of gate lines is outward of the buried data/sense line and is obliquely angled relative to the line of active area and the line of dielectric isolation. A vertical transistor channel region is within the active area between the pair of gate lines. An outer source/drain region is in the active area above the channel region and an inner source/drain region is in the active area below the channel region. The inner source/drain region is electrically coupled to the buried data/sense line. Other attributes as described above may be used.

In one embodiment, the line of active area comprises a first line of active area and further comprises a second line of active area. The first and second lines of active area are on opposing sides of the line of dielectric isolation. The buried data/sense line is directly against each of the first and second lines of active area. In one embodiment, the vertical transistor device further comprises semiconductive material beneath and interconnecting the first and second lines of active area, with the buried data/sense line having a base directly against the semiconductive material. The buried data/sense line may also comprise opposing sides individually directly against one of the first and second lines of active area.

An embodiment of the invention includes a memory array. Such comprises lines of active area alternating with lines of dielectric isolation. Buried data/sense lines obliquely angle relative to the lines of active area and the lines of dielectric isolation. Pairs of gate lines are outward of the buried data/sense lines and obliquely angle relative to the lines of active area and the lines of dielectric isolation. An individual vertical transistor channel region is within the active area between the gate lines of individual pairs of gate lines. Pairs of outer and inner source/drain regions are in the active area above and below, respectively, the individual channel regions. The inner source/drain regions individually are electrically coupled to individual buried data/sense lines.

Individual charge storage components electrically couple to individual outer source/drain regions. In one embodiment, the charge storage components are capacitors, and regardless in one embodiment the memory array comprises DRAM. In one embodiment, the memory array may comprise a doped isolation region within the lines of active area between immediately adjacent buried data/sense lines. In one embodiment, the inner source/drain regions are directly against the individual buried data/sense lines. The embodiment of FIGS. 1-8 depicts an example such memory array. Other attributes as shown in such figures and/or as described above may be used.

Embodiments of the invention include methods of forming a plurality of vertical transistor devices, as an example in forming the vertical transistor devices of FIGS. 1-7. Example precursor structures to that shown by FIG. 1 are shown in FIGS. 9-11.

Figure 9:
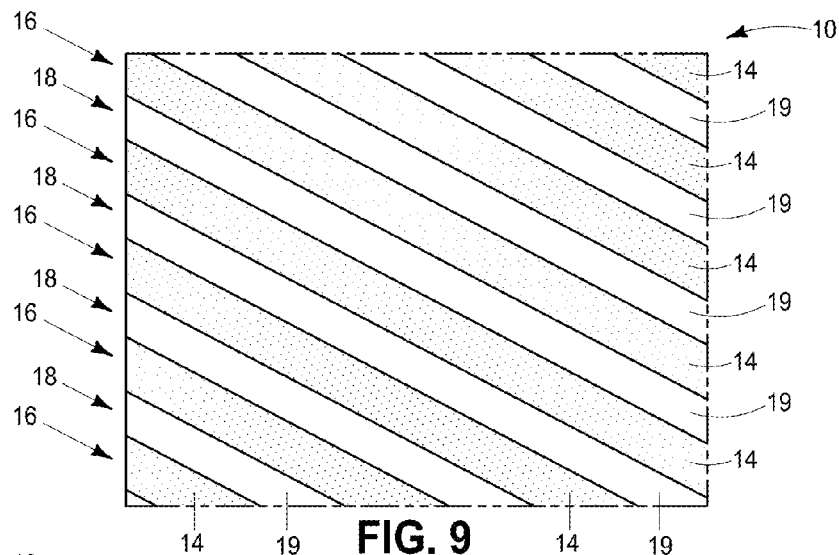
FIG. 9 is a reduced scale diagrammatic top plan view of a substrate fragment in process for producing the structure of FIGS. 1-7.

Referring to FIG. 9, active area lines 16 are formed to alternate with lines 18 of dielectric isolation 19 within a semiconductor substrate.

Figure 10:
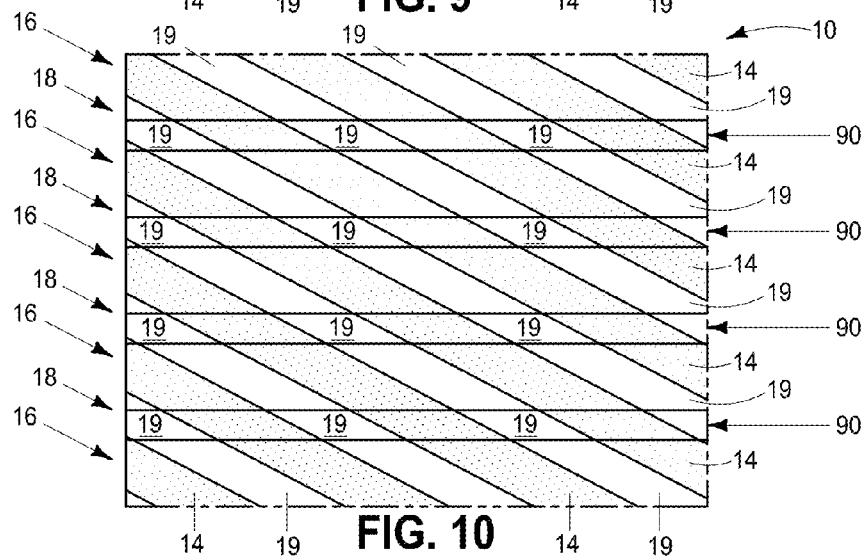
FIG. 10 is a view of the FIG. 9 substrate at a processing step subsequent to that shown by FIG. 9.

Referring to FIG. 10, buried data/sense line trenches 90 have been etched into active area lines 16 and dielectric isolation lines 18. Buried data/sense line trenches 90 angle obliquely relative to active area lines 16 and dielectric isolation lines 18. An example angle is from about 10° to about 60° relative to horizontal in the depicted figure. Individual dielectric isolation lines 18 underlie multiple buried data/sense line trenches 90.

Figure 11:
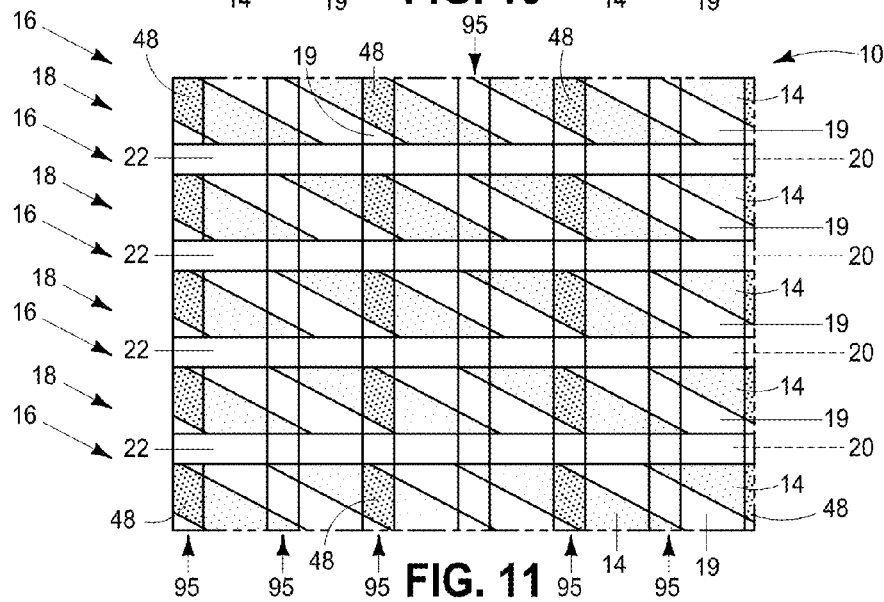
FIG. 11 is a view of the FIG. 10 substrate at a processing step subsequent to that shown by FIG. 10.

Referring to FIG. 11, data/sense lines 20 have been formed within buried data/sense line trenches 90. Such may be capped with dielectric material 22. Gate line trenches 95 have been etched into the semiconductor substrate. Gate line trenches 95 angle obliquely relative to active area lines 16 and dielectric isolation lines 18, and bifurcate active area 14 between two immediately adjacent data/sense lines 20. Outer source/drain regions 38, inner source/drain regions 40, and channel regions 32 may be formed within the active area, for example as shown in the FIGS. 1-7 embodiment. Further, conductive gate line pairs 29 within gate line trenches 95 may be formed, for example as also shown in the FIGS. 1-7 embodiment.

In one embodiment, a doped isolation region 48 may be formed within active area lines 16 between immediately adjacent buried data/sense lines 20, and in one embodiment between immediately adjacent inner source/drain regions 40. The forming of doped isolation regions 48 and inner source/drain regions 40 may comprise respective ion implantings. In one embodiment, the ion implanting for inner source/drain regions 40 occurs before the ion implanting for doped isolation regions 48. In one embodiment, the forming of the outer source/drain regions 38 comprises an ion implanting. In one embodiment, the ion implanting for outer source/drain regions 38 occurs after the ion implanting for doped isolation regions 48.

Any other attributes as shown and/or described with respect to FIGS. 1-8 may be used in method embodiments of the invention.

CONCLUSION

In some embodiments, a vertical transistor device comprises a line of active area adjacent a line of dielectric isolation. A buried data/sense line obliquely angles relative to the line of active area and the line of dielectric isolation. A pair of gate lines is outward of the buried data/sense line and obliquely angles relative to the line of active area and the line of dielectric isolation. A vertical transistor channel region is within the active area between the pair of gate lines. An outer source/drain region is in the active area above the channel region and an inner source/drain region is in the active area below the channel region. The inner source/drain region is electrically coupled to the buried data/sense line.

In some embodiments, a plurality of vertical transistor devices comprises lines of active area alternating with lines of dielectric isolation. Buried data/sense lines obliquely angle relative to the lines of active area and the lines of dielectric isolation. Pairs of gate lines are outward of the buried data/sense lines and obliquely angle relative to the lines of active area and the lines of dielectric isolation. An individual vertical transistor channel region is within the active area between the gate lines of individual pairs of the gate lines. Pairs of outer and inner source/drain regions are in the active area above and below, respectively, the individual channel regions. The inner source/drain regions individually are electrically coupled to individual buried data/sense lines.

In some embodiments, a memory array comprises lines of active area alternating with lines of dielectric isolation. Buried data/sense lines obliquely angle relative to the lines of active area and the lines of dielectric isolation. Pairs of gate lines are outward of the buried data/sense lines and obliquely angle relative to the lines of active area and the lines of dielectric isolation. An individual vertical transistor channel region is within the active area between the gate lines of individual pairs of the gate lines. Pairs of outer and inner source/drain regions are in the active area above and below, respectively, the individual channel regions. The inner source/drain regions individually are electrically coupled to individual buried data/sense lines. Individual charge storage components electrically couple to individual outer source/drain regions.

In some embodiments, methods of forming a plurality of vertical transistor devices are employed. Individual devices comprise an outer source/drain region, an inner source/drain region, and a channel region each formed within an active area. A plurality of gate line pairs are on opposing sides of multiple channel regions. A plurality of buried data/sense lines angle beneath the gate line pairs. The inner source/drain regions individual electrically couple to individual buried data/sense lines. Such methods form lines of active area alternating with lines of dielectric isolation within a semiconductor substrate. Buried data/sense line trenches are etched into the lines of active area and lines of dielectric isolation. The buried data/sense line trenches angle obliquely relative to the lines of active area and the lines of dielectric isolation. Individual lines of dielectric isolation underlie multiple buried data/sense line trenches. Data/sense lines are formed within the buried data/sense line trenches. Gate line trenches are etched into the semiconductor substrate. The gate line trenches angle obliquely relative to the lines of active area and the lines of dielectric isolation, and the gate line trenches bifurcate the active area between two immediately adjacent data/sense lines. The conductive gate line pairs are formed within the gate line trenches. The outer and inner source/drain regions and the channel regions are formed within the active area.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a plurality of vertical transistor devices; individual devices comprising an outer source/drain region, an inner source/drain region, and a channel region each formed within an active area; a plurality of gate line pairs on opposing sides of multiple channel regions; a plurality of buried data/sense lines angling beneath the gate line pairs; the inner source/drain regions individual electrically coupling to individual buried data/sense lines, the method comprising:

forming lines of active area alternating with lines of dielectric isolation within a semiconductor substrate;

etching buried data/sense line trenches into the lines of active area and lines of dielectric isolation, the buried data/sense line trenches angling obliquely relative to the lines of active area and the lines of dielectric isolation, individual lines of dielectric isolation underlying multiple buried data/sense line trenches;

forming the data/sense lines within the buried data/sense line trenches;

etching gate line trenches into the semiconductor substrate, the gate line trenches angling obliquely relative to the lines of active area and the lines of dielectric isolation and bifurcating the active area between two immediately adjacent data/sense lines;

forming the conductive gate line pairs within the gate line trenches; and forming the outer and inner source/drain regions and the channel regions within the active area.

2. The method of claim 1 comprising forming a doped isolation region within the lines of active area between immediately adjacent buried data/sense lines.

3. The method of claim 2 comprising forming the doped isolation region within the lines of active area between immediately adjacent inner source/drain regions.

4. The method of claim 2 wherein the forming the doped isolation regions and the forming the inner source/drain regions comprise respective ion implantings, the ion implanting for the inner source/drain regions occurring before the ion implanting for the doped isolation region.

5. The method of claim 2 wherein the forming the doped isolation regions and the forming the outer source/drain regions comprise respective ion implantings, the ion implanting for the outer source/drain regions occurring after the ion implanting for the doped isolation region.

6. The method of claim 5 wherein the forming of the inner source/drain regions comprises an ion implanting, the ion implanting for the inner source/drain regions occurring before the ion implanting for the doped isolation region.

7. The method of claim 1 comprising forming the gate lines within individual of the pairs of gate lines to be parallel one another.

8. The method of claim 7 comprising forming the data/sense lines to be perpendicular relative to the gate line pairs.

9. The method of claim 1 comprising forming the data/sense lines and the gate lines to be longitudinally straight.

10. The method of claim 1 comprising forming the inner source/drain regions to individually be directly against a sidewall of individual of the buried data/sense lines.

11. The method of claim 1 comprising forming the gate lines within individual of the pairs of gate lines to be parallel and longitudinally straight relative one another.

12. The method of claim 11 comprising forming the data/sense lines to be perpendicular relative to the pairs of gate lines.

13. A method of forming a plurality of vertical transistor devices; individual devices comprising an outer source/drain region, an inner source/drain region, and a channel region each formed within an active area; a gate line operably proximate a sides of multiple channel regions; a plurality of buried data/sense lines angling beneath the gate lines; the inner source/drain regions individual electrically coupling to individual buried data/sense lines, the method comprising:

forming lines of active area alternating with lines of dielectric isolation within a semiconductor substrate;

etching buried data/sense line trenches into the lines of active area and lines of dielectric isolation, the buried data/sense line trenches angling obliquely relative to the lines of active area and the lines of dielectric isolation, individual lines of dielectric isolation underlying multiple buried data/sense line trenches;

forming the data/sense lines within the buried data/sense line trenches;

etching gate line trenches into the semiconductor substrate, the gate line trenches angling obliquely relative to the lines of active area and the lines of dielectric isolation and bifurcating the active area between two immediately adjacent data/sense lines;

forming the conductive gate lines within the gate line trenches; and forming the outer and inner source/drain regions and the channel regions within the active area.

14. The method of claim 13 comprising forming the outer source/drain regions to individually have an outer target contact area having a trapezoidal shaped perimeter considered horizontally.

15. The method of claim 13 comprising forming the outer source/drain regions to individually have an outer target contact area having a pentagonal shaped perimeter considered horizontally.

16. The method of claim 13 comprising forming a charge storage component electrically coupled to individual of the outer source/drain regions.

17. The method of claim 16 wherein the charge storage component is directly against the individual outer source/drain region and directly against the dielectric isolation.

18. The method of claim 16 wherein,
the charge storage component is formed directly against the individual outer source/drain region;
the individual outer source/drain region is formed to have an outer target contact area having a trapezoidal shaped perimeter considered horizontally or a pentagonal shaped perimeter considered horizontally; and
the charge storage component is formed to be directly against only a portion of the individual outer target contact area.

19. The method of claim 18 comprising forming the inner source/drain regions to be directly against bottoms of the individual buried data/sense lines.

20. The method of claim 13 comprising forming a doped isolation region within the lines of active area between immediately adjacent buried data/sense lines.

* * * * *